US012622286B2

(12) United States Patent (10) Patent No.: US 12,622,286 B2

Ho et al. (45) Date of Patent: May 5, 2026

(54) SIDE-WETTABLE SEMICONDUCTOR PACKAGE DEVICE WITH HEAT DISSIPATION SURFACE STRUCTURE

(71) Applicant: PANJIT INTERNATIONAL INC., Kaohsiung City (TW)

(72) Inventors: Chung-Hsiung Ho, Kaohsiung City (TW); Chi-Hsueh Li, Tainan City (TW); Yung-Hui Wang, Kaohsiung City (TW); Wen-Liang Huang, Kaohsiung City (TW)

(73) Assignee: PANJIT INTERNATIONAL INC., Kaohsiung City (TW)

( * ) Notice: Subject to any disclaimer, the term of this patent is extended or adjusted under 35 U.S.C. 154(b) by 413 days.

(21) Appl. No.: 18/345,476

(22) Filed: Jun. 30, 2023

(65) Prior Publication Data

US 2024/0355716 A1 Oct. 24, 2024

(30) Foreign Application Priority Data

Apr. 24, 2023 (TW) .................................. 112115099

(51) Int. Cl.
H10W 70/40 (2026.01)
H10W 74/10 (2026.01)

(52) U.S. Cl.
CPC ....... H10W 70/461 (2026.01); H10W 70/421 (2026.01); H10W 70/465 (2026.01); H10W 74/111 (2026.01)

(58) Field of Classification Search
CPC ........... H01L 23/49568; H01L 23/3107; H01L 23/49541; H01L 23/49524

USPC .......................................................... 257/675
See application file for complete search history.

(56) References Cited

U.S. PATENT DOCUMENTS

| | | | |
|---|---|---|---|
| 2023/0015323 A1* | 1/2023 | Kim ......................... | H01L 24/49 |
| 2023/0187306 A1* | 6/2023 | Zhang ................... | H02M 7/003 257/675 |

FOREIGN PATENT DOCUMENTS

| | | |
|---|---|---|
| CN | 10444515 A | 11/2019 |
| TW | 201421636 A | 6/2014 |

\* cited by examiner

*Primary Examiner* — Norman D Richards
(74) *Attorney, Agent, or Firm* — BACON & THOMAS, PLLC

(57) ABSTRACT

A die of the package device is covered by an encapsulation layer, a plurality of lead portions are configured on the bottom surface of the encapsulation layer, a side portion of each lead portion is also exposed on a side surface of the encapsulation layer, and thereby the package device is used as a side-wettable package device; wherein, in a process of manufacturing the package device, a conductive electroplated conducting layer is formed on the surface of the encapsulation layer, and the electroplated conducting layer is used to conduct electric power required during an electroplating process. After the electroplating process is completed, the electroplated conducting layer can be used as a heat dissipation layer for the package device. The heat dissipation layer completely covers the surface of the package device so as to increase heat dissipation area and to be attached by a heat sink.

9 Claims, 7 Drawing Sheets

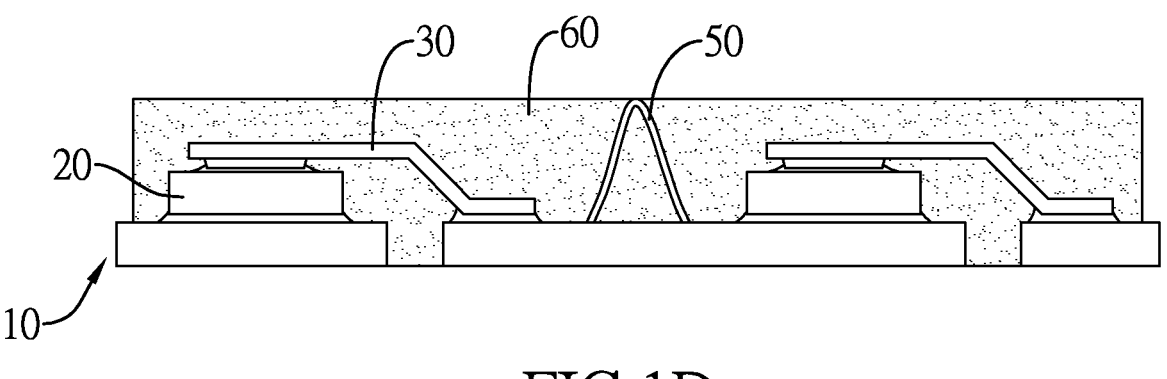
FIG.1D
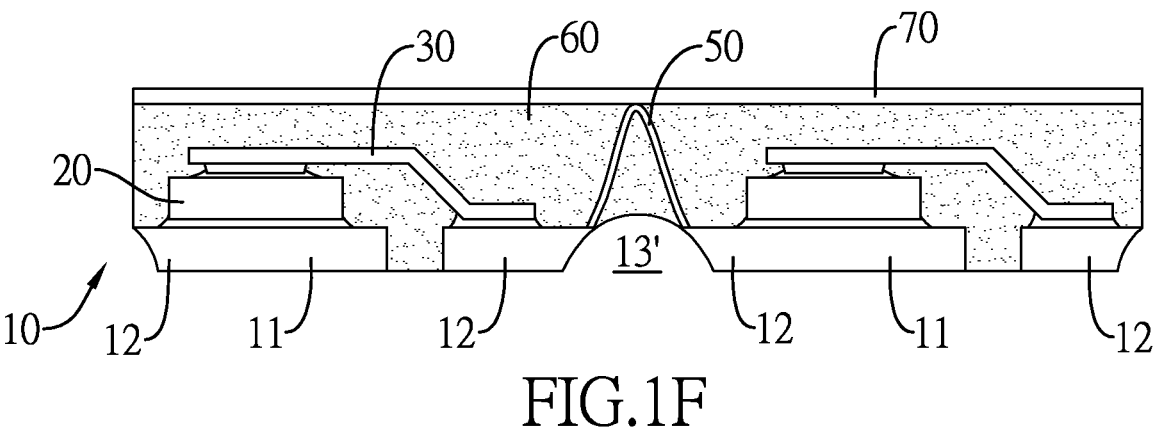
FIG.1E
FIG.1F

SIDE-WETTABLE SEMICONDUCTOR PACKAGE DEVICE WITH HEAT DISSIPATION SURFACE STRUCTURE

CROSS REFERENCE TO RELATED APPLICATION(S)

This non-provisional application claims the benefit under 35 U.S.C. § 119(e) to patent application No. 112115099 filed in Taiwan on Apr. 24, 2023, which is hereby incorporated in its entirety by reference into the present application.

BACKGROUND OF THE INVENTION

1. Field of the Invention

The present invention relates to a side-wettable semiconductor package device, especially to a side-wettable semiconductor package device with an electroplated heat dissipation surface structure.

2. Description of the Related Art

For a leadless package device, when observing an upper surface of the package device from a top view, there is no lead extending outward from sides of the leadless package device, for example a Quad Flat No-Lead (QFN) package device or a Dual Flat No-Lead (DFN) package device, and the bond pads of such type of package device are formed on the bottom surface of the package device. To make it easier for an inspection instrument (e.g. Automated Optical Inspection, AOI) to judge whether the QFN/DFN package device is properly soldered, metal surfaces are further extended from all bond pads to expose on the sides of the package device, so that during a soldering process, the solder can be adsorbed to the metal surfaces on the sides of the package device. A package device with such a structure of exposed metal surfaces on the sides of the package device for convenience in inspecting soldering quality is called a side-wettable package device. However, the existing leadless package devices have limited heat dissipation capability which needs to be further improved.

SUMMARY OF THE INVENTION

In view of the aforementioned, the main purpose of the present invention is to provide a side-wettable semiconductor package device with a heat dissipation surface structure, having a side wettable effect, and further having an increased heat conduction area to improve heat dissipation efficiency.

To achieve the aforesaid purpose, the present invention discloses the side-wettable semiconductor package device with the heat dissipation surface structure including:

- an encapsulation layer having a bottom surface, a top surface and a plurality of sides;
- a die, wrapped inside the encapsulation layer;
- a heat dissipation layer, formed on the top surface of the encapsulation layer by electroplating, and without electrically connecting to the die;
- a clip, one side of which is electrically connected to the die;
- a plurality of lead portions formed by cutting a same lead frame, wherein one part of the lead portions is electrically connected to the die, and another part of the lead portions is electrically connected to another side of the clip; and each lead portion is wrapped in the encapsulation layer and exposed on a bottom and the sides of the encapsulation layer, and a side of the lead portion forms an indented gap which is indented from the side of the encapsulation layer.

In addition, the present invention discloses a process, wherein a conductive electroplated conducting layer is formed on a surface of the encapsulation layer, and the electroplated conducting layer is used to conduct electric power required during an electroplating process which electroplates exposed surfaces of each lead portion. After the electroplating process is completed, the electroplated conducting layer can be used as a heat dissipation layer for the package device. As the heat dissipation layer completely covers the surface of the package device, heat dissipation area is increased, and the heat dissipation area may further attach to a heat sink to improve heat dissipation efficiency.

The present invention further discloses a process of a side-wettable semiconductor package device with a heat dissipation surface structure, including the steps:

- gluing a plurality of dies on an upper surface of a lead frame, wherein the lead frame has a plurality of adjacently disposed device units, and a scribe line is defined between each pair of adjacent device units, and each device unit has a central die pad and a plurality of lead portions surrounding said device unit, and on each central die pad, a die of the plurality of dies is glued;
- connecting electrically the die in each device unit to the lead portions surrounding said device unit;
- connecting electrically an electroplated connector between adjacent device units of the lead frame, and the electroplated connector being above the scribe line;
- forming an encapsulation layer to cover the die of each device unit and the electroplated connectors, wherein a lower surface of the lead frame is exposed on the encapsulation layer;
- forming an electroplated conducting layer on an upper surface of the encapsulation layer, and making the electroplated conducting layer electrically contact the electroplated connector;
- performing a first cut to the lower surface of the lead frame along the scribe line to expose the sides of each lead portion without cutting through the encapsulation layer;
- utilizing the electroplated conducting layer and the electroplated connector to conduct power to electroplate the lead frame, so as to form an electroplated protection layer on a bottom surface of each central die pad, a bottom surface and side surfaces of each lead portion, and the surface of the electroplated conducting layer;
- performing second cuts on the encapsulation layer along the scribe lines to completely cut through the encapsulation layer to obtain isolated semiconductor package devices, wherein the electroplated connector is completely cut off without remains in the semiconductor package device.

BRIEF DESCRIPTION OF THE DRAWINGS

FIGS. 1A-1H are steps of the first embodiment of the process of the present invention;

DETAILED DESCRIPTION OF THE INVENTION

In the following, the technical solutions in the embodiments of the present invention will be clearly and fully described with reference to the drawings in the embodiments of the present invention. Obviously, the described embodiments are only a part of, not all of, the embodiments of the present invention. Based on the embodiments of the present invention, all other embodiments obtained by a person of ordinary skill in the art without creative efforts shall fall within the protection scope of the present invention.

Figure 1A:
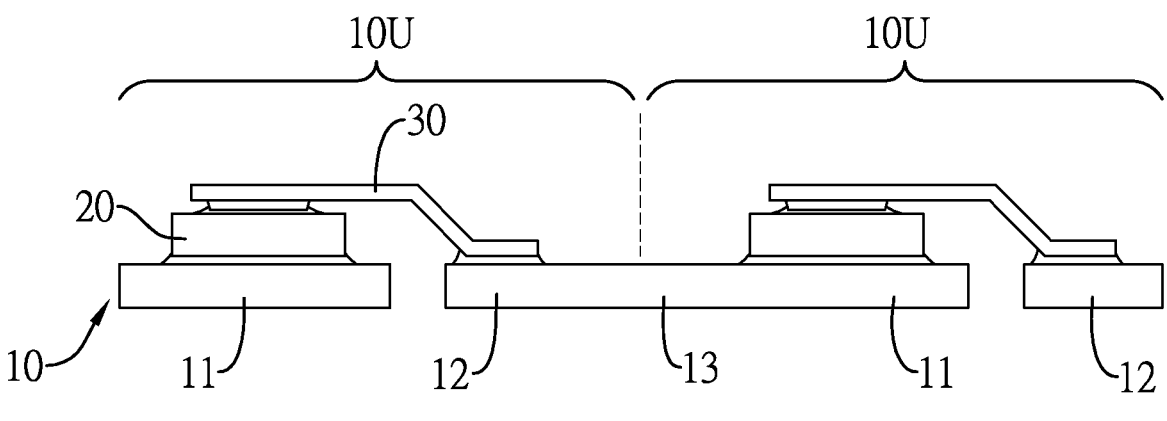
Figure 1B:
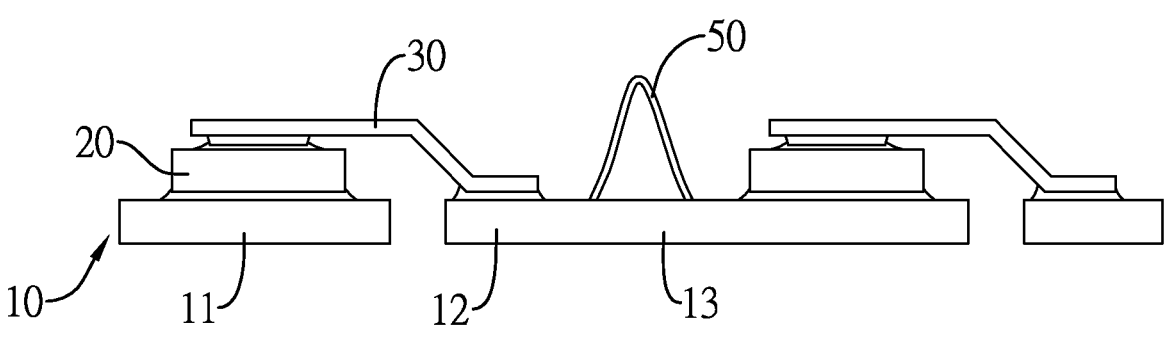

The present invention is a package device, and in one embodiment, a QFN or DFN package device is taken as examples. FIG. 1A to FIG. 1H are steps of the process of the present invention. FIG. 1A shows a package work-in-process (WIP). The package WIP mainly includes: a lead frame 10, a plurality of dies 20 and a plurality of clips 30; additionally referring to FIG. 2, the lead frame 10 has a plurality of adjacently disposed device units 10U, and each device unit 10U is to be made into a single package device, and each device unit 10U includes a central die pad 11 and a plurality of lead portions 12 surrounding the central die pad 11. According to various lead frame 10 designs, the central die pad 11 can be connected with some lead portions 12, or some other lead portions 12 can be connected with each other. Adjacent device units 10U are physically connected through a connection portion 13, which is also a preset scribe line region. Two sides of the connection portion 13 are respectively connected to lead portions 12 of different device units 10U.

A die 20 is glued on the central die pad 11 of each device unit 10U. Several bond pads 21 are provided on one surface or two opposite surfaces of the die 20, and these bond pads 21 are electrically connected to the surrounding lead portions 12. For example, in a bonding process, a part of the bond pads 21 are electrically connected to corresponding lead portions 12 through metal bond wires 40, while other parts of the bond pads 21 are electrically connected to other corresponding lead portions 12 through clips 30.

Each clip 30 is a one-piece structure, one side of the clip 30 is used for electrically connecting a bond pad 21 of the die 20, and the other side of the clip 30 is electrically connecting to a corresponding lead portion 12.

Please refer to FIG. 1B again. In the present invention, an electroplated connector, such as a conducting piece or an electroplated conducting wire 50 is electrically connected between adjacent device units 10U. In this embodiment, the electroplated conducting wire 50 is taken as an example. The electroplated conducting wire 50 is a metal wire, which is configured in the same bonding step as the metal bond wire 40. The position of said connected electroplated conducting wire 50 is above the connection portion 13, and the two ends of the electroplated conducting wire 50 are respectively connected to surfaces of the adjacent device units 10U, for example, connected to outer sides of the lead portions 12 of the adjacent device units 10U.

Figure 1C:
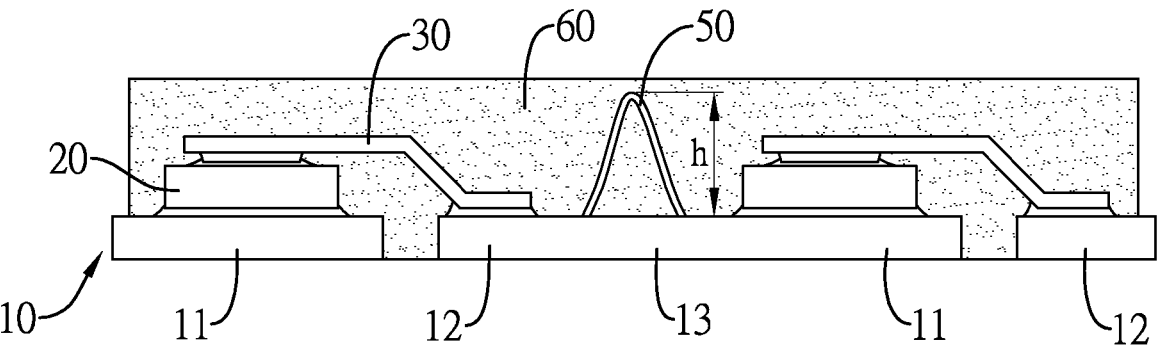
Figure 2:
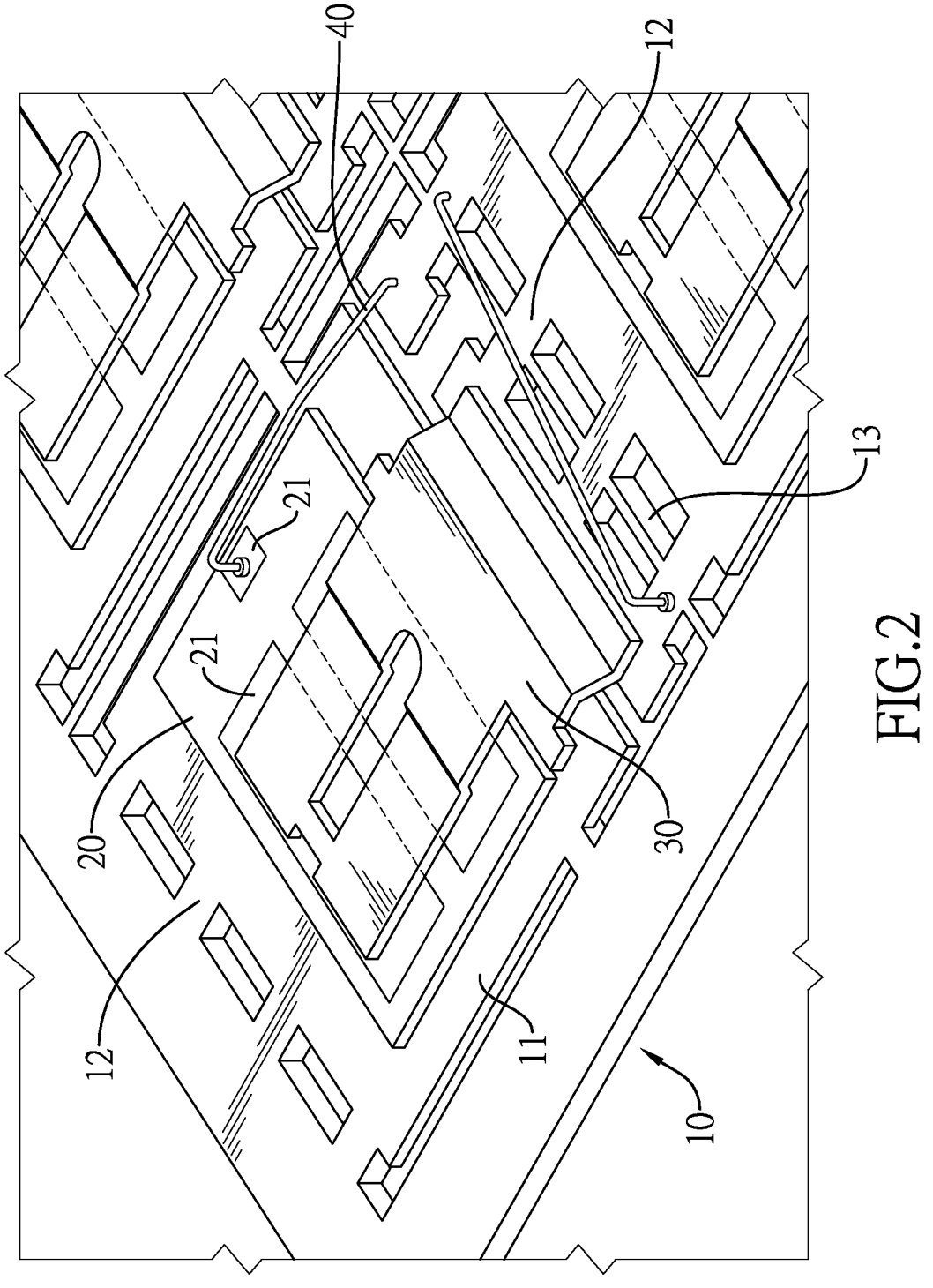
FIG. 2 shows a schematic view of an electroplated conductive wire connected between adjacent device units of the lead frame of the present invention.

Please refer to FIG. 1C: in one embodiment, after configuring the electroplated conducting wire 50, an encapsulation layer 60 (e.g. epoxy molding compound) is formed on an upper surface of the lead frame 10. A lower surface of the lead frame 10 is exposed without being covered by the encapsulation layer 60, and the encapsulation layer 60 covers the dies 20, the clips 30 and the metal bond wires 40.

If the thickness of the encapsulation layer 60 is greater than the height of the electroplated conducting wire 50, then, through a grinding step the surface of the encapsulation layer 60 is ground to reduce the thickness of the encapsulation layer 60 as shown in FIG. 1D; as a result, part of the electroplated conducting wire 50 is exposed on the surface of the encapsulation layer 60. In another embodiment, in the wire bonding step, a height of the electroplated conducting wire 50 is stretched to be slightly larger than the thickness of the to-be-formed encapsulation layer 60, so that part of the electroplated conducting wire 50 can be exposed on the surface of the encapsulation layer after the encapsulation layer is formed. However, in whichever embodiment, the main purpose is to expose part of the electroplated conducting wire 50 without being covered by the encapsulation layer 60, on the surface of the encapsulation layer 60.

Please refer to FIG. 1E: an electroplated conducting layer 70 is formed on an upper surface of the encapsulation layer 60. The electroplated conducting layer 70 fully covers the surface of the encapsulation layer 60, and the electroplated conducting layer 70 is electrically connected with the electroplated conducting wire 50 which is exposed on the surface of the encapsulation layer 60. In one embodiment, the electroplated conducting layer 70 is a titanium/copper metal layer formed by sputtering.

Please refer to FIG. 1F: a first cut is performed on the bottom surface of the lead frame 10 along the scribe lines 13' surrounding each device unit 10U. The first cut is to cut off the connection portion 13 to expose a side surface of each lead portion 12 of each device unit 10, and the depth of the first cut is limited to only exposing the bottom surface of the encapsulation layer 60.

Please refer to FIG. 1G again. The lead frame 10 is electroplated to form an electroplated protection layer 80, and the electroplated protection layer 80 may be a Tin layer. Because the adjacent device units 10U are electrically connected through the electroplated conducting layer 70 and the electroplated conducting wire 50, when electroplating is performed, power for electroplating can be applied to the electroplated conducting layer 70, and transmitted to each device unit 10U through the electroplated conducting layer 70, so that the surface of the lead frame 10 exposed in each device unit 10U can be electroplated with the electroplated protection layer 80, and at the same time, a surface of the electroplated conducting layer 70 also forms the electroplated protection layer 80. After completing the electroplating operation, a bottom surface of the central die pad 11 in each device unit 10, a bottom surface, and the side surface of each lead portion 12 are electroplated with the electroplated protection layer 80.

Figures 1G, 1H:
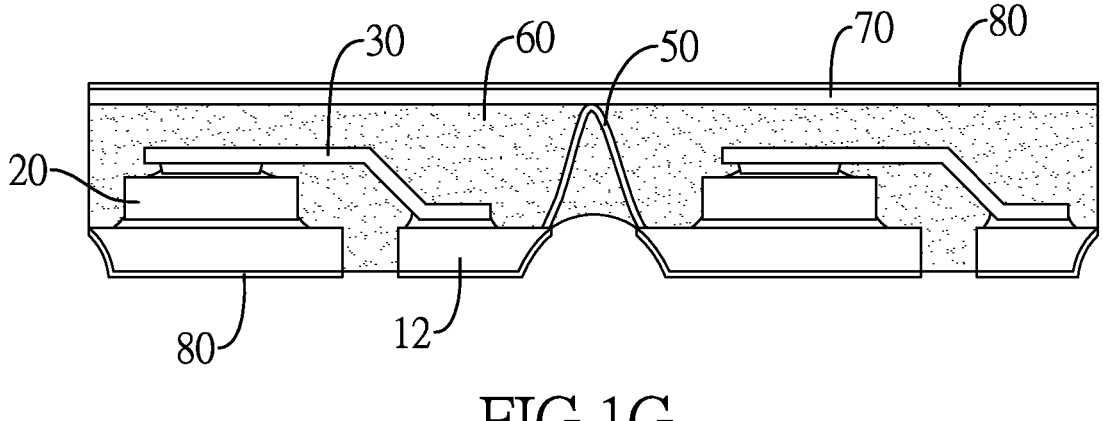

Please refer to FIG. 1H: after the electroplated protection layer 80 is completed, a unitization operation is performed. A second cut is performed to the encapsulation layer 60 along the position of the first cut, which overlaps the position of the connection portion 13 between adjacent device units 10U. The second cut completely cuts through the encapsulation layer 60. By selecting a cutting tool B of a suitable width, the electroplated conducting wire 50 can be completely removed. After the second cut is completed, a plurality of isolated semiconductor package devices can be obtained.

Figure 3:
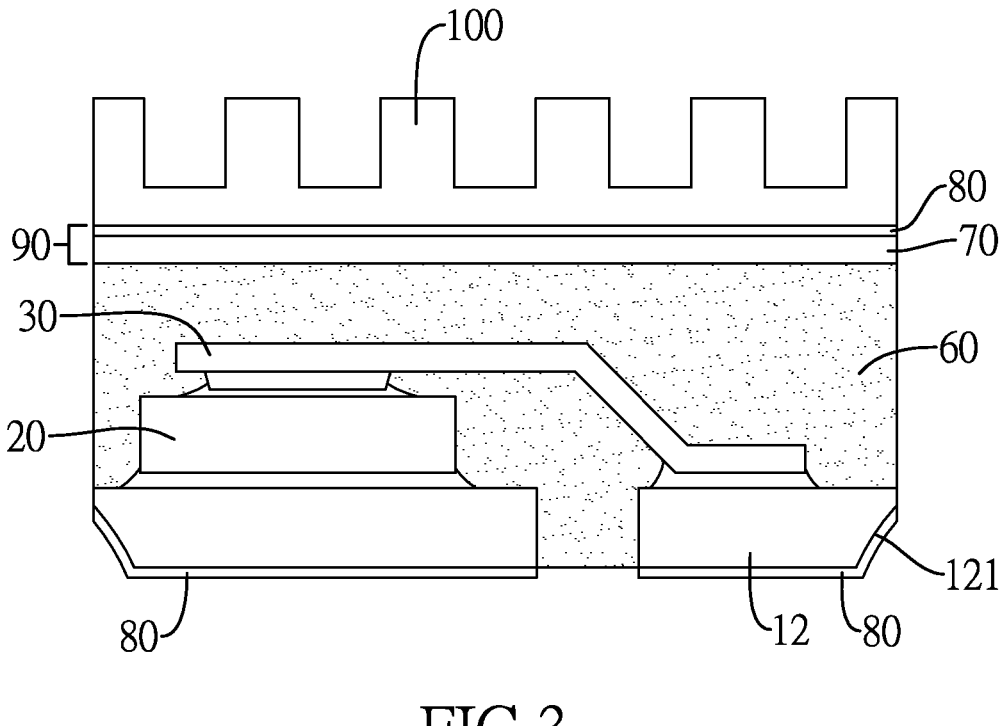
FIG. 3 shows a schematic view of a heat sink configured on a surface of a package device of the present invention.

Please refer to FIG. 3: the finished semiconductor package device is also a package device only with no-outward-extension pins. The bottom surface of each lead portion 12 or the bottom surface of the central die pad 11 can be soldered on the circuit board. On one side of each lead portion 12, an indented gap 121 is formed, and the electroplated protection layer 80 is electroplated on a surface of the indented gap 121. When the package device 80 is soldered on the circuit board, the solder can be adsorbed to the electroplated protection layer 80 on the indented gap 121, thereby facilitating image inspection instrument to check the adhesion of the solder. In addition, the stacked original electroplated protection layer 80 and electroplated conducting layer 70 together form a heat dissipation layer 90 on the surface of the package device which completely covers the surface of the package device to provide more heat dissipation area. In practical applications, a heat sink 100 can be further provided on the surface of the heat dissipation layer 90 to additionally increase the heat dissipation area.

Please refer to FIGS. 4A-4E, which are portions of the steps of the second embodiment of the process of the present invention. Firstly, please refer to FIG. 4A. The second embodiment differs from the first embodiment in that the connection portion 13 between adjacent device units 10U is pre-reduced in thickness from the bottom surface through processing steps such as partial etching, half-cutting, etc. so as to achieve the purpose of thinning the connection portion 13.

Figure 4A:
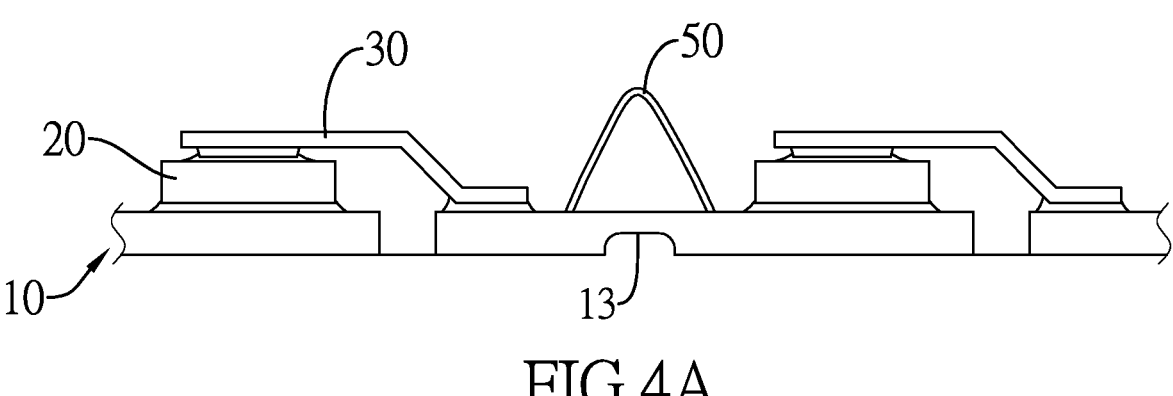
FIGS. 4A-4E are portions of the steps of the second embodiment of the process of the present invention.
Figure 4B:
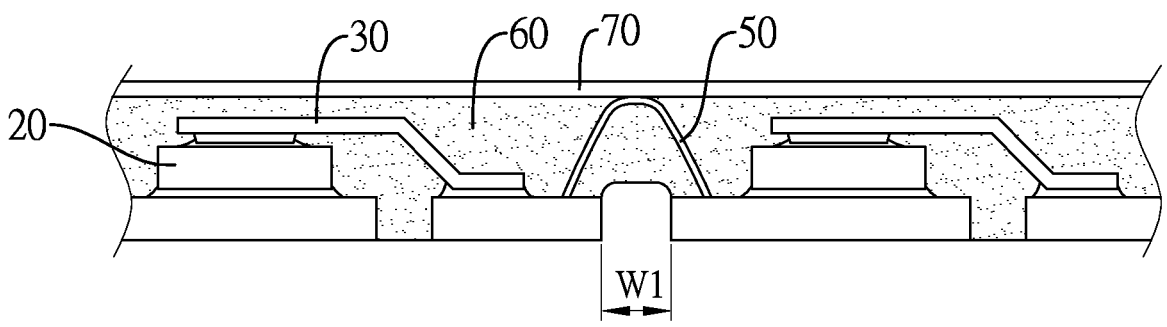

In FIG. 4B, after the encapsulation layer 60 and the electroplated conducting layer 70 are sequentially formed on the surface of the lead frame 10, as shown in FIG. 1F of the first embodiment, a first cutting tool performs the first cut which cuts off the connection portion 13 to expose the encapsulation layer 60, and a cutting width formed by the first cut is a first width W1.

Figure 4C:
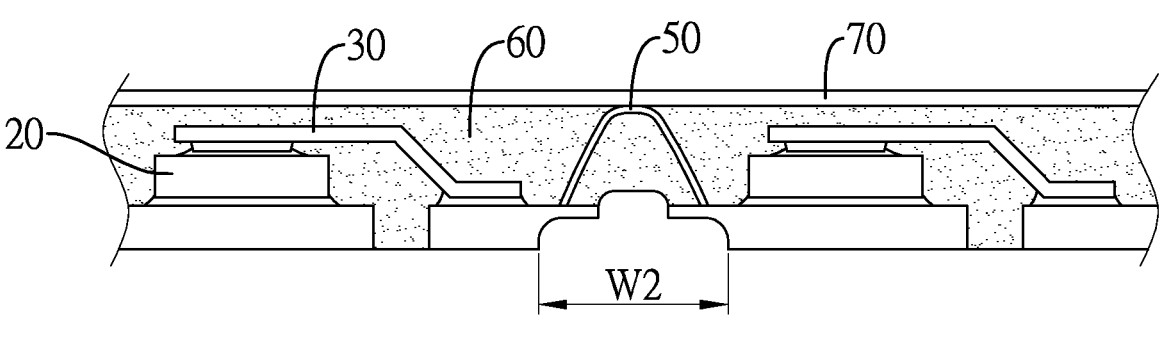

In FIG. 4C, a second cutting tool performs a second cut on the bottom surface of the lead frame 10 along the position of the first cut. The depth of the second cut is smaller than the thickness of the lead frame 10; as a result, the encapsulation layer 60 is not damaged by the second cut. The width of the second cutting tool is greater than that of the first cutting tool, so a cutting width formed on the lead frame 10 is a second width W2 which is greater than the first width W1.

Figure 4D:
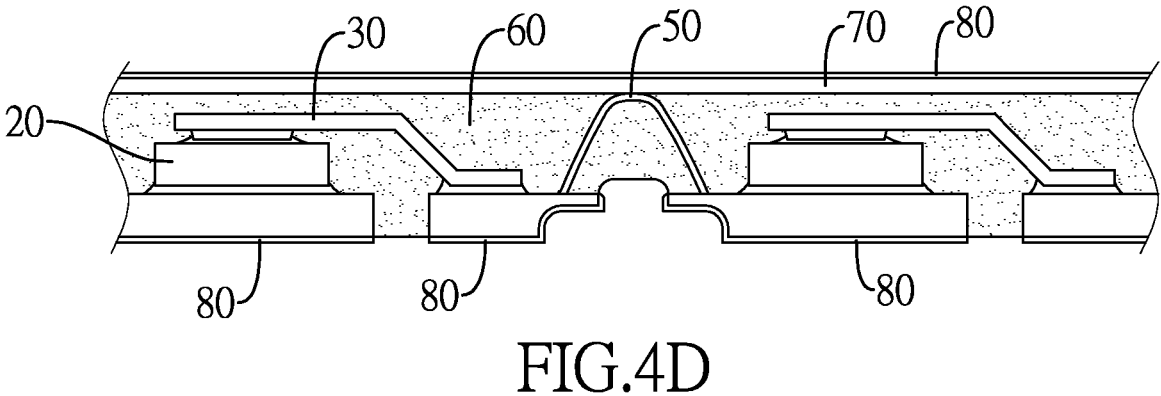

Please refer to FIG. 4D. The lead frame 10 is electroplated to form an electroplated protection layer 80, just as the step of FIG. 1G of the first embodiment, when performing electroplating, power for electroplating can be applied to the electroplated conducting layer 70, and transmitted to each device unit 10U through the electroplated conducting layer 70, so that the surface of the lead frame 10 exposed in each device unit 10U can be electroplated with the electroplated protection layer 80. After the electroplating step is completed, the electroplated protection layer 80 is electroplated on the bottom surface of the central die pad 11 in each device unit 10, and on the bottom surface and side surfaces of each lead portion 12.

Figure 4E:
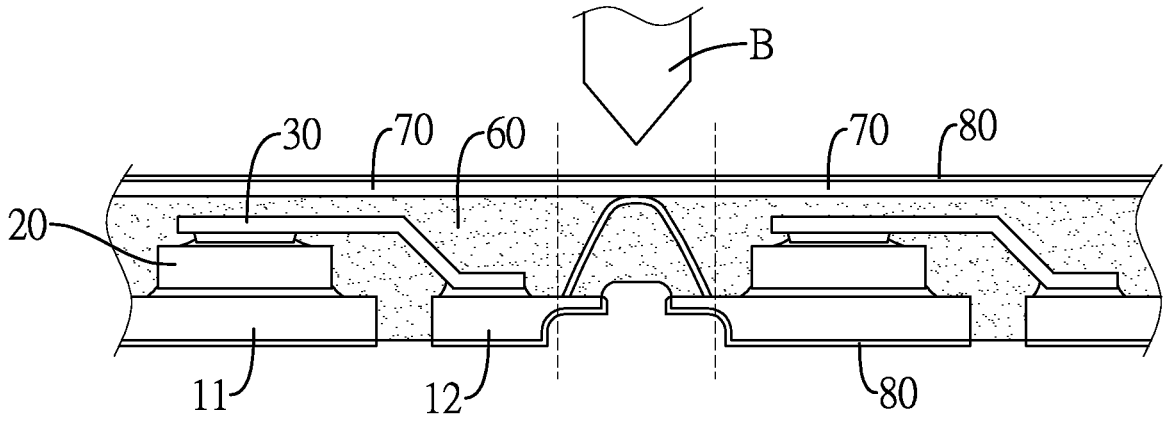

Please refer to FIG. 4E. After completing the electroplated protection layer 80, a unitization operation is performed, wherein a final cut for the encapsulation layer 60 is performed along the position of the first cut which overlaps the position of the connection portion 13 between adjacent device units 10U. The final cut completely severs the encapsulation layer 60 and completely removes the electroplated conducting wire 50. After completing the final cut, a plurality of isolated semiconductor package devices can be obtained, and the structure of each semiconductor package device is also as shown in FIG. 3.

The present invention utilizes the electroplated conducting wire and electroplated conducting layer connected between adjacent device units to transmit the electric potential required for electroplating to each device unit. An electroplated protection layer is formed on each lead portion of each device unit. The finished semiconductor package device has a wettable structure on its sides for solder attachment, so as to facilitate inspection of solder attachment by an image inspection instrument. In addition, the surface of the package device has a heat dissipation layer formed by the stacked electroplated conducting layer and electroplated protection layer. The heat dissipation layer covers the surface of the package device to increase the heat dissipation area, and a heat sink can be further attached to the surface of the package device to additionally increase the heat dissipation efficiency of the package device.

The aforementioned are preferred embodiments of the present invention. It should be noted that for those of ordinary skill in the art, without departing from the principles of the present invention, certain improvements and retouches of the present invention can still be made, which are nevertheless considered as within the protection scope of the present invention.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A side-wettable semiconductor package device with a heat dissipation surface structure, including:
   an encapsulation layer having a bottom surface, a top surface and a plurality of sides;
   a die, wrapped inside the encapsulation layer;
   a heat dissipation layer, formed on the top surface of the encapsulation layer by electroplating, and without electrically connecting to the die;
   a clip, one side of which is electrically connected to the die;
   a plurality of lead portions formed by cutting a same lead frame, wherein one part of the lead portions is electrically connected to the die, and another part of the lead portions is electrically connected to another side of the clip; and each lead portion is wrapped in the encapsulation layer and exposed on a bottom and the sides of the encapsulation layer, and a side of the lead portion forms an indented gap which is indented from the side of the encapsulation layer;
   wherein the heat dissipation layer includes an electroplated conducting layer, and an electroplated protection layer is formed on exposed surfaces of each lead portion and on the electroplated conducting layer.

2. The side-wettable semiconductor package device with a heat dissipation surface structure as claimed in claim 1, wherein the heat dissipation layer completely covers the top surface of the encapsulation layer.

3. The side-wettable semiconductor package device with a heat dissipation surface structure as claimed in claim 1, further including:
   a central die pad to which the die is attached, and the central die pad being surrounded by the plurality of lead portions.

4. The side-wettable semiconductor package device with a heat dissipation surface structure as claimed in claim 3, wherein a bottom of the central die pad is exposed without being covered by the encapsulation layer.

5. The side-wettable semiconductor package device with a heat dissipation surface structure as claimed in claim 1, wherein the clip is wrapped inside the encapsulation layer.

6. The side-wettable semiconductor package device with a heat dissipation surface structure as claimed in claim 1, wherein the electroplated conducting layer is disposed on the top surface of the encapsulation layer.

7. The side-wettable semiconductor package device with a heat dissipation surface structure as claimed in claim 3, wherein the electroplated protection layer is also disposed on a bottom surface of the central die pad and the portions of each lead portion which are exposed on the bottom and the sides of the encapsulation layer.

8. The side-wettable semiconductor package device with a heat dissipation surface structure as claimed in claim 1, wherein cutting the same lead frame includes performing a first cut and then a second cut along scribe lines on the lead frame, and the first cut is performed on the bottom surface of the lead frame only to expose a side surface of each lead portion, and the second cut is performed to completely cut through the encapsulation layer and the heat dissipation layer.

9. The side-wettable semiconductor package device with a heat dissipation surface structure as claimed in claim 8, wherein a cutting width of the first cut is a first width, a cutting width of the second cut is a second width, and the second width is greater than the first width.

\* \* \* \* \*